(12) United States Patent
Elhami Khorasani et al.

(10) Patent No.: US 11,056,590 B1
(45) Date of Patent: Jul. 6, 2021

(54) SENSING DEVICE FOR HIGH VOLTAGE APPLICATIONS

(71) Applicant: SEMICONDUCTOR COMPONENTS INDUSTRIES, LLC, Phoenix, AZ (US)

(72) Inventors: Arash Elhami Khorasani, Phoenix, AZ (US); Mark Griswold, Gilbert, AZ (US); Richard Taylor, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/781,434

(22) Filed: Feb. 4, 2020

(51) Int. Cl.
*H01L 29/78* (2006.01)
*H01L 29/10* (2006.01)

(52) U.S. Cl.
CPC ...... *H01L 29/7835* (2013.01); *H01L 29/1033* (2013.01)

(58) Field of Classification Search
CPC . H01L 29/7835; H01L 29/1033; H02M 3/335
See application file for complete search history.

(56) References Cited

U.S. PATENT DOCUMENTS

| | | | |
|---|---|---|---|
| 7,306,999 B2 | 12/2007 | Hall et al. | |
| 7,638,405 B2 | 12/2009 | Hall et al. | |
| 7,803,643 B2 | 9/2010 | Hall et al. | |
| 2004/0196077 A1 | 10/2004 | Wilhelm | |
| 2013/0106466 A1 | 5/2013 | Tseng et al. | |
| 2016/0036315 A1 | 2/2016 | Ohashi et al. | |
| 2017/0019095 A1* | 1/2017 | Leong | H03K 17/687 |
| 2017/0264184 A1 | 9/2017 | Tezuka et al. | |
| 2019/0363196 A1* | 11/2019 | Wood | H01L 29/417 |

* cited by examiner

*Primary Examiner* — Changhyun Yi
(74) *Attorney, Agent, or Firm* — Brake Hughes Bellermann LLP

(57) ABSTRACT

In a general aspect, an integrated circuit (IC) can include a low-voltage region including a low-side driver circuit configured to control a low-side switch of a power converter. The IC can also include a high-voltage region including a floating region of a first conductivity and a high-voltage sensing device disposed in the floating region. The high-voltage sensing device can include a junction-field effect transistor (JFET), and a voltage divider. The voltage divider can include a first terminal coupled to a drain of the JFET, a second terminal coupled to a gate of the JFET, and a sense terminal, the voltage divider being configured to a provide, on the sense terminal. The IC can further include a high-side driver circuit coupled with the sense terminal. The high-side driver circuit can be configured to control a high-side switch of the power converter based on the voltage on the sense terminal.

21 Claims, 11 Drawing Sheets

SENSING DEVICE FOR HIGH VOLTAGE APPLICATIONS

TECHNICAL FIELD

This disclosure relates to semiconductor devices that can sense voltage and/or current in a high-voltage domain, such as for use in power conversion. More specifically, this disclosure relates to high-voltage domain sensing devices that can be included (e.g., monolithically included) in an integrated control circuit (e.g., for a power converter).

BACKGROUND

Power converters, such as direct-current to direct-current (DC-DC) or alternating-current to direct-current (AC-DC) power converters are used in a wide range of applications. For instance, such power converters can be used in cloud-computing servers, automotive applications, industrial applications, etc. In some implementations, high-voltage supplies are used by such power converters. For instance, such high-voltage supplies can be 400 volts (V), 500 V, 600 V, 700 V, etc. Implementations of such power converters can include an inductive-capacitive (LC) resonant transformer circuit and a switch circuit that can control charging and power delivery by the LC resonant transformer circuit. Such switch circuits can include a low-side switch (e.g., a power semiconductor switch operating in a low-voltage power domain or region), and a high-side switch (e.g., a power semiconductor switch operating in high-voltage power domain or region), where a switching node for the LC resonant transformer circuit is defined (located, etc.) between the high-side switch and the low-side switch. For instance, in some implementations, such a switch node can be located between a drain terminal of a low-side insulated-gate bipolar transistor (IGBT) and a source terminal of a high-side IGBT, where the source of the low-side IGBT is connected to electrical ground and the drain of the high-side IGBT is connected to a high-voltage (AC or DC) supply voltage. In some implementations, power transistor switch devices other than IGBTs (such as power field effect transistors) can be used.

Applications, such the examples above, that are implemented using such power converters can have performance and efficiency requirements that may not be achievable using current power converter implementations. In order to achieve such requirements, it may be desirable to implement zero-volt switching (ZVS) and/or current-based switching control. For instance, in some implementations, ZVS can be implemented to improve performance efficiency by controlling switching of the high-side and low side switches to switch between off and on states when their drain to source voltage are at (or near) zero, which reduce switching current (e.g., switching losses). In some implementations, (e.g., in pulse-width modulated AC-DC power converters), current-based switching control can improve performance and/or efficiency.

However, implementation of such performance and efficiency requirements in current power converter implementations can be difficult to achieve due, at least in part, to difficulties in obtaining accurate measurement (with low latency) of voltages and/or currents associated with switching operations of a given power converter. For instance, accurate voltage and/or current detection associated with high-side switches can be difficult to obtain due to the absence of a fixed ground reference for the high-side switch (e.g., a source terminal of a high-side switch can vary from 0 V to a value of an associated high-voltage supply). Current approaches, such as edge sensing on the switch node signal, and/or use of external (e.g., remote from an associated switching control circuit) voltage and/or current measurements may not be sufficient to meet performance requirements. For instance, such approaches may be subject to inaccuracy (e.g., due to soft or erratic switching), and/or latency in providing such measurements to switching control (e.g., high-side) circuitry.

SUMMARY

In a general aspect, an integrated circuit can include a low-voltage region and a high-voltage region that are included (disposed) in a semiconductor substrate. The low-voltage region can include a low-side driver circuit configured to control a low-side switch of a power converter. The high-voltage region can include a floating region of a first conductivity type, and a high-voltage sensing device disposed in the floating region. The high-voltage sensing device can include a junction-field effect transistor (JFET) and a voltage divider. The JFET can be configured to operate in pinch-off mode. The voltage divider can include a first terminal coupled to a drain of the JFET, a second terminal coupled to a gate of the JFET, and a sense terminal. The voltage divider can being configured to a provide, on the sense terminal, a voltage indicative of a voltage differential between the drain of the JFET and the gate of the JFET. The high-voltage region can also include a high-side driver circuit coupled with the sense terminal. The high-side driver circuit can be configured to control a high-side switch of the power converter based on the voltage on the sense terminal.

In another general aspect, an integrated circuit can include a low-voltage region and a high-voltage region that are included (disposed) in a semiconductor substrate. The low-voltage region can include a low-side driver circuit configured to control a low-side switch of a power converter. The high-voltage region can include a floating region of a first conductivity type, and a high-voltage sensing device disposed in the floating region. The high-voltage sensing device can include a first junction-field effect transistor (JFET) and a voltage divider. The first JFET can be configured to operate in pinch-off mode. The voltage divider can include a first terminal coupled to a drain of the first JFET, a second terminal coupled to a gate of the first JFET; and a sense terminal. The voltage divider can be configured to provide, on the sense terminal, a voltage indicative of a voltage differential between the drain of the first JFET and the gate of the first JFET. The high-voltage region can also include a high-side driver circuit coupled with the sense terminal. The high-side driver circuit can be configured to control a high-side switch of the power converter based on the voltage on the sense terminal. The integrated circuit can also include a high-voltage junction termination region surrounding the floating region. The high-voltage junction termination region can include a second JFET.

In another general aspect, an integrated circuit can include a low-voltage region and a high-voltage region that are included (disposed) in a semiconductor substrate. The low-voltage region can include a low-side driver circuit configured to control a low-side switch of a power converter. The high-voltage region can include a floating region of a first conductivity type, and a high-voltage sensing device disposed in the floating region. The high-voltage sensing device can include a junction-field effect transistor (JFET), and a resistive-capacitive voltage divider. The JFET can be configured to operate in pinch-off mode. The resistive-capacitive voltage divider can include a first terminal coupled to a drain of the JFET, a second terminal coupled to a gate of the JFET, and a sense terminal. The resistive-capacitive voltage divider can be configured to a provide, on the sense terminal, a voltage indicative of a voltage differential between the drain of the JFET and the gate of the JFET. The resistive-capacitive voltage divider can include a first capacitor coupled between the drain of the JFET and the sense terminal, a second capacitor coupled between the sense terminal and the gate of the JFET, and a spiral resistive element. The sense terminal can be coupled to the spiral resistive element so as to define a first resistor and a second resistor of the resistive-capacitive voltage divider, the first resistor can be coupled between the drain of the JFET and the sense terminal, and the second resistor being coupled between the sense terminal and the gate of the JFET. The high-voltage region can further include a high-side driver circuit coupled with the sense terminal. The high-side driver circuit can be configured to control a high-side switch of the power converter based on the voltage on the sense terminal.

Figure 1:
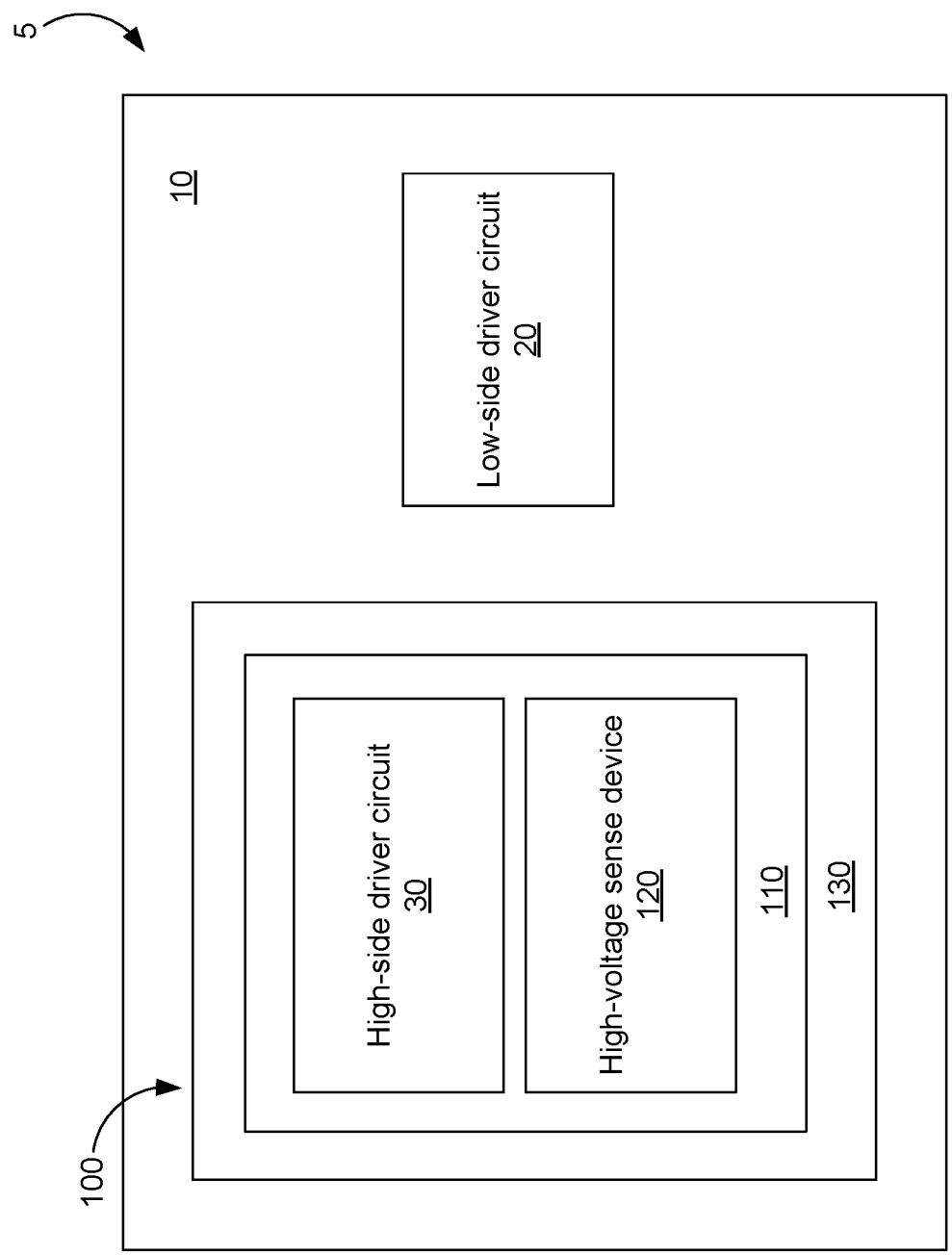
FIG. 1 is a block diagram illustrating a monolithic control device (e.g., a high-voltage integrated circuit) for a high-voltage power converter.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated. In some drawings, elements from related views may be omitted for purposes of clarity. In some drawings, some element may be shown by way of context and may not be specifically referenced and/or discussed in the following detailed description.

DETAILED DESCRIPTION

This disclosure relates to sensing devices that can be used to sense voltages and/or currents in a high-voltage domain (e.g., a high-voltage region of an integrated circuit). For instance, the sensing devices described herein can be included in a high-voltage region of a driver control circuit for a power converter, where such control circuits can be implemented as (implemented in) integrated circuits (ICs). Such ICs can be referred to as high-voltage (HV) ICs (HVICs), monolithic HVICs, etc. In other words, the sensing devices described herein can be monolithically implemented in an HVIC, such as in a high-voltage region of an HVIC, where the HVIC can also include a low-voltage region. In some implementations, the devices described herein can be used to implement (can be implemented in) a power converter, such as a direct-current to direct-current (DC-DC) power converter, an alternating-current to direct-current (AC-DC) power converter, and AC-AC converter, and so forth.

In some implementations, such as the examples described herein, a sensing device that can be included in a high-voltage region (operate in a high-voltage domain) of an HVIC can include a high-voltage field effect transistor (e.g., a 700 V junction FET (JFET) device) and an integrated voltage divider. Such a sensing device (e.g., integrated JFET and voltage divider) can be implemented in a high-voltage region (e.g., in a high-voltage floating pocket) of an HVIC and can provide voltage and/or current sensing capabilities corresponding with operation of a high-side power semiconductor switch of an associated power converter. In some implementations, terminals of such a sensing device can be connected between a high-voltage power supply bus (e.g., a Vbulk supply bus) and a high-voltage switching node of a power converter, and can provide a voltage sense (Vsense) signal that is indicative of a voltage of the switching node with respect to the power supply bus (e.g., a voltage differential between a switch node a Vbulk voltage). In such applications, the sensing device implementations described herein can have a blocking voltage that supports a high-voltage power supply bus voltage (e.g., 700V or greater) when a voltage of an associated switching node is 0 V. Likewise, the disclosed sensing device implementations can be configured to remain off (e.g., in pinch-off for integrated JFET devices) when the switch node rises to the voltage of the high-voltage power supply voltage, such as when a drain-to-source voltage of an associated high-side power switch is 0 V, and the sensing device indicates to corresponding high-side switch control circuitry that zero-volt switching (ZVS) can be performed.

In some implementations, terminals of such sensing devices can be connected across a high-side current sense resistor in a power converter, and can provide a voltage sense (Vsense) signal that is indicative of a current flowing through the current sense resistor. This current sense information can then be used by associated high-side switching control circuitry (e.g., pulse-width modulation (PWM) circuitry) to control switching of a high-side power switch of a power converter (e.g., based on comparison with a threshold). Such current sense information can also be used, in some implementations, for fault control (e.g., PWM fault control), such as to turn off a high-side power switch when the sense voltage indicates that a current through the high-side current sense resistor exceeds a threshold value (e.g., to prevent damage to an associated power converter circuit or a device including such a power converter, and/or to prevent a hazardous conditions, such as an electrical fire, from occurring).

In the example implementations described herein, because a high-voltage sensing device is disposed in a high-voltage region (e.g., high-side, high-voltage domain, etc.) of a power converter HVIC, such a sensing device can also be located physically proximate to associated high-side switching control circuitry. Accordingly, in such implementations, sense information (e.g., voltage or current sense information) can be communicated from the sensing device to the high-side switching control circuitry with low latency, as compared to approaches that use remote sensing (e.g. off-chip, separate sensing device, etc.) techniques, where latency can occur due to, e.g., signal propagation delays and/or signal voltage-level shifting delays.

FIG. 1 is a block diagram illustrating a monolithic control device (e.g., a gate driver, a HVIC, a gate control device, etc.) that can be used to implement a high-voltage power converter (e.g., a DC-DC converter or an AC-DC converter). The example HVIC of FIG. 1 is monolithically implemented in a semiconductor substrate 5. Depending on the particular implementation, the substrate 5 can be a silicon substrate, a silicon carbide substrate, a gallium nitride substrate, a gallium arsenide substrate, etc. As shown in FIG. 1, the substrate 5 can include (have disposed therein) a low-voltage region 10 and a high-voltage region 100. The low-voltage region 10 (which can be referred to as a low-voltage circuit domain, etc.) can include a low-side driver circuit 20, which can be configured to control a low-side switch in a power converter, such as in the example implementations described herein.

The high-voltage region 110 (which can be referred to as a high-voltage circuit domain, etc.) can include a high-voltage floating pocket 110, in which high-voltage circuitry can be disposed. In the HVIC of FIG. 1, a high-side driver circuit 30 and a high-voltage sensing device 120 (such as an implementation of the high-voltage sensing devices described herein) can be disposed in the floating pocket 110.

As shown in FIG. 1, the high-voltage region 100 of the illustrated example HVIC can also include a high-voltage termination region 130 (high-voltage termination region, high-voltage junction termination region, dielectric termination region, etc.). The high-voltage termination region can terminate (distribute, spread, etc.) high voltages that are present within the floating pocket 110 (e.g., voltages associated with circuitry implemented in the floating pocket 110), so as to isolate the low voltage region 10 from those high voltages. For instance, in some implementations, circuitry implemented in the low voltage region can operate at voltages between 5 V and 20 V, while circuitry in the high-voltage region 100 (e.g., in the floating pocket 110) can operate at voltages of the 400 V, or greater (e.g., 600 V, 700 V, etc.) The high-voltage termination region 130 can be configured to reduce (terminate) those high voltages so that they low-voltage region (and circuitry included therein) is not subject to (and potentially damaged by) such high-voltages. In some implementations, the high-voltage termination region 130 can be referred as being a separate region from the high voltage-region 100 (e.g., not included in the high-voltage region 100 or the low-voltage region 100), but being as being a transition region (e.g., a voltage domain transition region) between the high-voltage region 100 and the low-voltage region 10.

Figure 2:
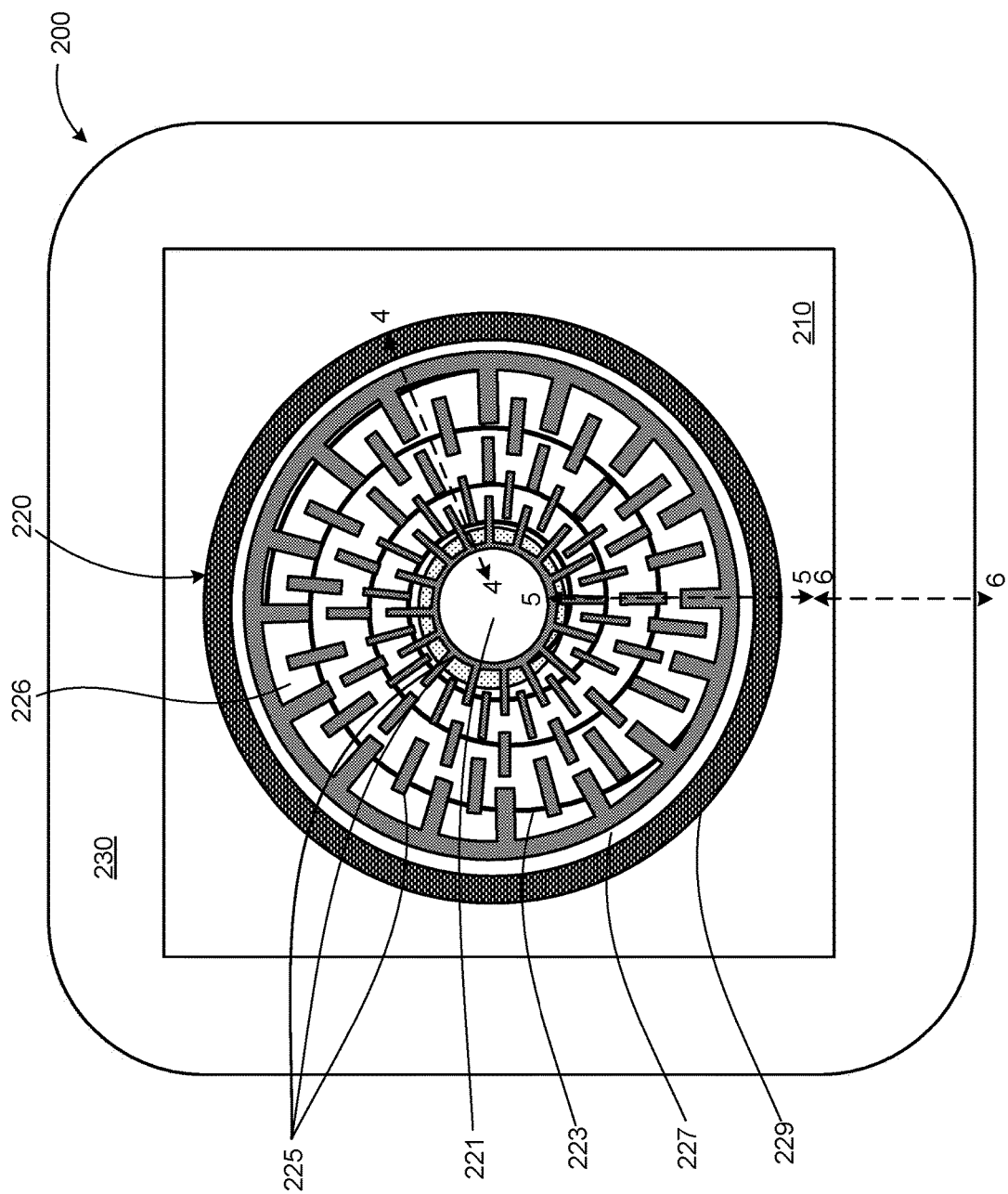
FIG. 2 is a diagram schematically illustrating a top level view (e.g., a layout plan view) of a high-voltage sensing device that can be implemented in a high-voltage integrated circuit (HVIC), such as the HVIC of FIG. 1.
Figure 3:
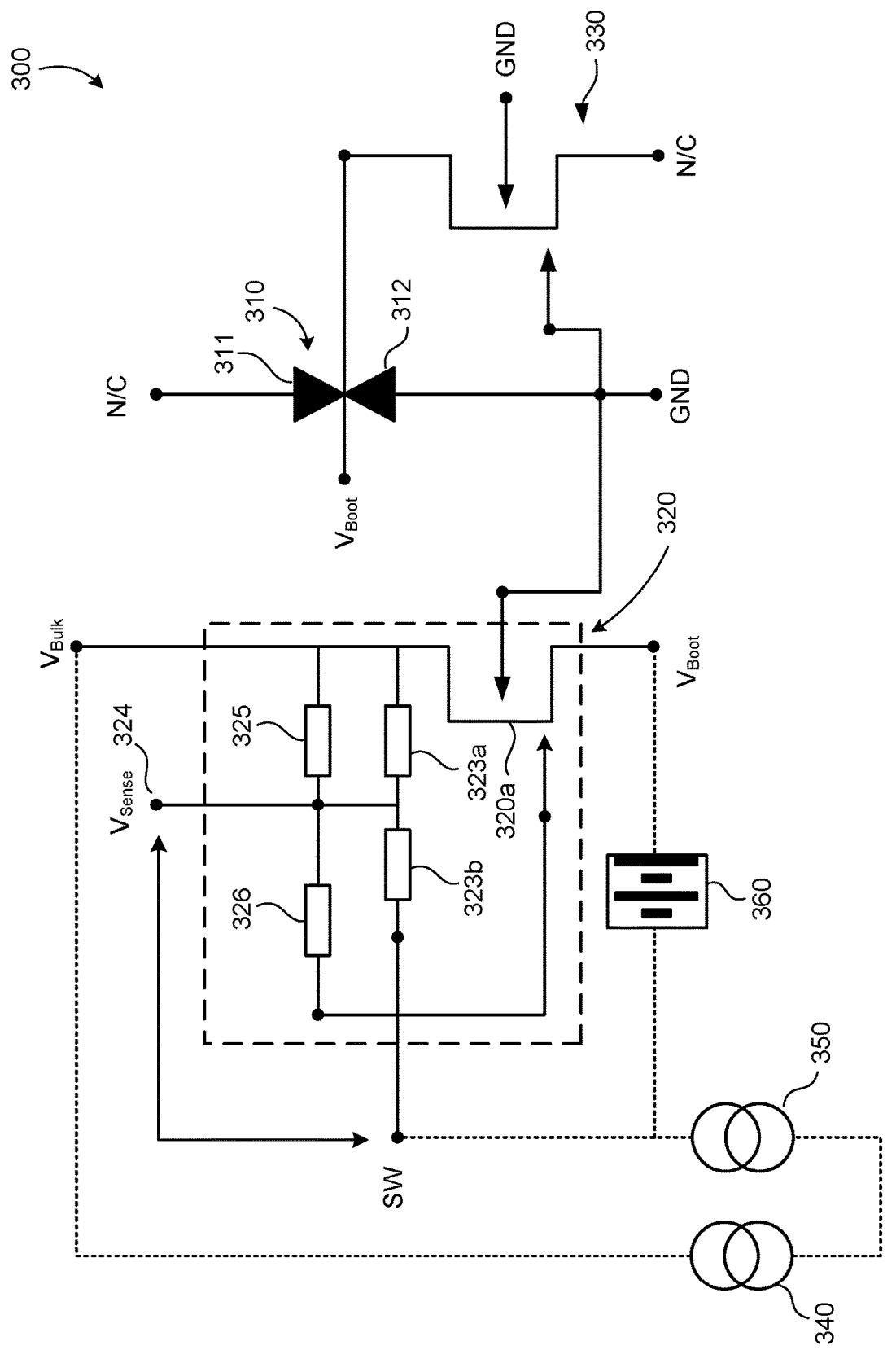
FIG. 3 is a schematic diagram illustrating an implementation of the high-voltage sensing device of FIG. 2.

FIGS. 2-6 illustrate examples of high-voltage sensing devices that can be implemented (monolithically implemented) in a high-voltage portion of a power converter HVIC, such as to implement the high-voltage sensing device 120 of the monolithic HVIC illustrated in FIG. 1. In the examples of FIGS. 2-6, example elements of high-voltage regions of an HVIC, including high voltage sensing devices are illustrated. However, for purposes of clarity, other high-voltage domain circuitry (e.g., of an HVIC) is not shown in FIGS. 2-6. As appropriate, and for purposes of illustration in the following discussion, the example implementations shown in FIGS. 2-6, where appropriate, are described in conjunction with one another. In the example implementation of FIG. 2, the sensing device 220 is a circularly arranged device that includes an integrated JFET and a voltage divider that are integrated in the circularly arranged sensing device 220. Sectional (dashed) lines are indicated in FIG. 2, which indicate portions of the sensing device 220 that are illustrated by the example cross-sectional diagrams of FIGS. 4-6. Accordingly, examples of various aspects of the implementations of FIG. 2 and FIG. 3 are further illustrated and discussed with respect to FIGS. 4-6 below.

FIG. 2 is a diagram that schematically illustrates a top level view (e.g., a layout plan view) of a high-voltage region 200 of an HVIC that includes a high-voltage sensing device 220. In some implementations, the sensing device 220 can be implemented in a high-voltage integrated circuit (HVIC), such as in the HVIC of FIG. 1 (e.g., to implement the high-voltage sensing device 120). As noted above, other high-voltage domain circuitry (e.g., high-side driver control circuitry, etc.) can be included in the high-voltage region 200, though that circuitry is not specifically shown in FIG. 2. FIG. 3 is a schematic diagram illustrating a high-voltage region 300 that can correspond with (can be implemented by) the high-voltage region 200 of FIG. 2. Accordingly, for purposes of illustration, and by way of example, FIGS. 2 and 3 are described in conjunction with one another.

Referring first to FIG. 2, the illustrated high-voltage region 200 includes a high-side floating pocket 210, a high voltage sensing device 220 and a high-voltage termination region 230. Referring to FIG. 3, with further reference to FIG. 2, a high-side floating pocket portion 310 (corresponding with the high-side floating pocket 210) includes diodes 311 and 312. In this example, the diode 311 has a floating (no connect, N/C) on its anode, which corresponds to the floating pocket. In some implementations, the anode of the diode 311 can be connected in other ways, such as to a power supply node, a switch node, etc. The diodes 311 and 312 have a shared cathode (e.g., defined by a buried layer below the floating pocket) that is coupled with the Vboot voltage. The diode 312 has a grounded anode (e.g., defined by a semiconductor substrate in which the high-voltage region 300 is implemented). Again, examples of these elements of the high-side floating pocket are shown in the cross-sectional view of, at least, FIG. 5.

Figure 6:
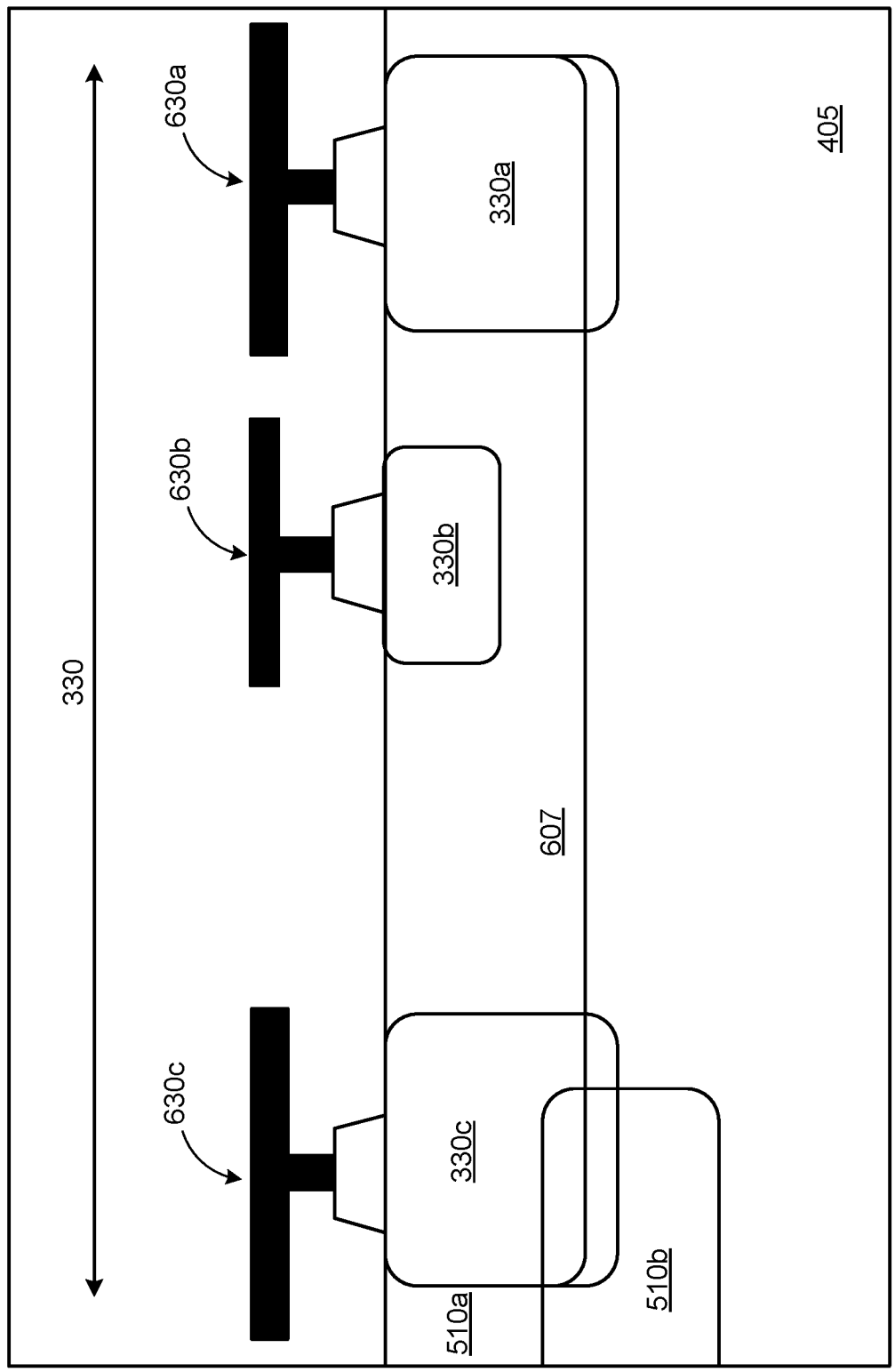
FIG. 6 is a diagram schematically illustrating a cross-sectional view of a high-voltage termination portion of the high voltage sensing device of FIGS. 2 and 3.

Still with reference to FIG. 3, and with further reference to FIG. 2, the high-voltage region 300 includes a high-voltage sensing device 320 (FIG. 3) that corresponds with the high-voltage sensing device 220 (FIG. 2). The high-voltage region 300 of FIG. 3 also further includes a JFET 330 that can implement (correspond with) the high-voltage junction termination region 230 of the FIG. 2, an example of which is illustrated in FIG. 6. In some implementations, other devices, such as a laterally-diffused metal-oxide-semiconductor (LDMOS) transistor can be used to implement the high-voltage junction termination region.

As illustrated in FIG. 3, in addition to the elements of the high-voltage region 300 discussed above, the schematic diagram of FIG. 3 also includes a high-voltage power (Vbulk) supply 340 (e.g., a 700 V supply), and a power supply 350 corresponding with (representing) a voltage on a switch node SW of a power converter circuit including the circuit of the high-voltage region 300 of FIG. 3. For instance, the voltage represented by the power supply 350 can be a voltage on a switching node of a corresponding resonant transformer circuit (e.g., a voltage that varies from 0 V to a Vbulk voltage).

The schematic of FIG. 3 also includes a power supply 360 that can provide a supply voltage (e.g., Vcc voltage) for an HVIC including the high-voltage region 300 (e.g., the high-voltage region 200), as well as other elements of an HVIC, such as high-side driver control circuitry (in a high-voltage region of the HVIC) and low-side driver control circuitry (in a low-voltage region of the HVIC). In some implementations, the supply 350 (e.g., a switch node SW voltage) can vary between 0 V and the voltage of the (Vbulk) supply 340 (e.g., 700 V in this example). The Vcc supply 360, depending on the particular implementation, can provide a voltage between 5 V and 20 V. In some implementations, the Vcc supply 360 can provide other voltages, e.g. voltages less than 5 V or greater than 20 V.

Figure 7:
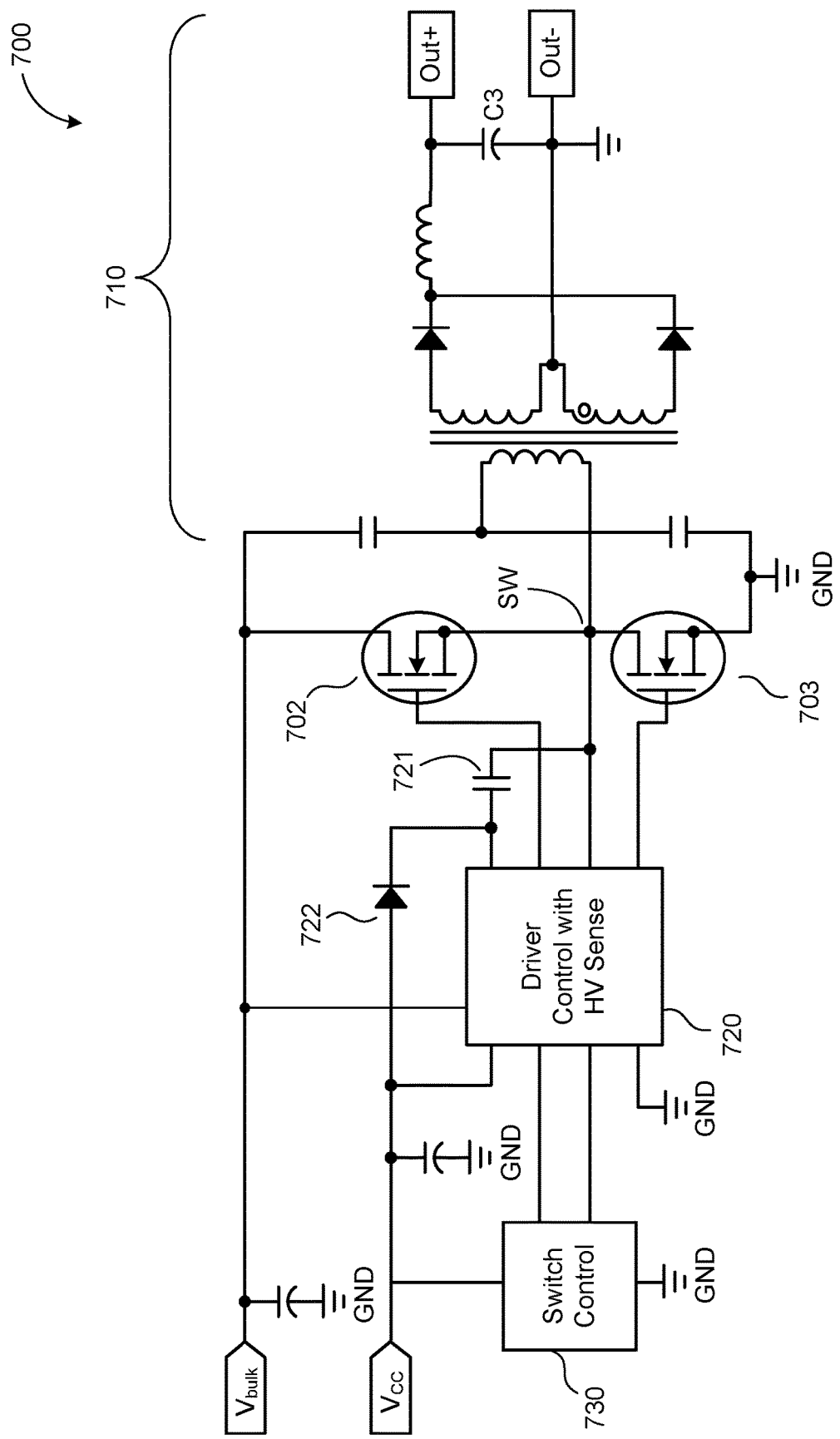
FIG. 7 is a schematic block diagram illustrating a power converter circuit in which the high-voltage sensing device of FIGS. 2 and 3 can be implemented.

In some implementations, a bootstrap circuit (e.g., including a diode and a capacitor, such as shown in FIG. 7) that is used to supply a boot voltage (Vboot) to the HVIC, and the sensing device 320 (also 220) and other elements of the high-voltage region 300 (also 200), as shown in FIG. 3. In some implementations, Vboot can be a combined voltage (e.g., sum) of the switching node (e.g., supply 350) voltage and a Vcc supply voltage (e.g., supply 360), such as is schematically illustrated in FIG. 3. Accordingly, in this example, Vboot will be greater than the switching node voltage by Vcc, which will cause the JFET 320a to operate in pinch-off (e.g., because their gate-to-source voltages will remain negative during operation). The supplies 340, 350 and 360 are not shown in FIG. 2.

Referring again to FIG. 2, the sensing device 220 includes a drain region 221 of an integrated JFET of the sensing device 220 (e.g., JFET 320a in FIG. 3), a spiral resistive element 223, metal features 225, a dielectric region 226, a source and gate region 227 of the integrated JFET, and a separation region 229. Examples of each of these regions, as well as examples of the high-side floating pocket 210 and the high-voltage junction termination 230, are shown in the cross-sectional views of FIGS. 4-6, which are described below.

In FIG. 2, the resistive element 223 can be a spiral polysilicon resistive element that is used to define two resistors of a voltage divider integrated in the sensing device 220, such as the resistors 323a and 323b shown in FIG. 3. In this example implementation, the integrated voltage divider is implemented as a resistive-capacitive (RC) divider. In some implementations, a resistive divider, or a capacitive divider can be used. In some implementations, other types of resistive elements can be used.

In this example, the metal features 225 can provide electrical contacts for the sensing device 220. For instance, the metal features 225 can provide a Vbulk (supply 340) connection (e.g., using the central ring of the metal features 225) to the drain 221 of the integrated JFET, such as shown by the Vbulk connection to a drain terminal of the JFET 320a in FIG. 3. The metal features 225 can also define a Vsense connection, which can be a tap from the metal features 225 (e.g., using the outer ring shown in FIG. 2) to the resistive element 223. In some implementations, such a tap can define two resistors of the integrated voltage divider of the sensing device 220 from the resistive element 223 (such as the resistors 323a and 323b shown in FIG. 3). In some implementations, a ratio of resistance of the resistor 323a to a resistance of the resistor 323b can be 100 to 1, 110 to 1, 120 to 1, etc. In some implementations, different resistance ratios can be used. In the example implementations described herein, a voltage on Vsense can be used to make determinations for zero voltage switching of a high-side switch of a power converter, or to make current-based decisions for switching a high-side switch for PWM switching or PWM fault control.

The metal features 225, in conjunction with the dielectric region 226 of the sensing device 220, can also define at least one capacitor of the integrated RC voltage divider of the sensing device 200, such as the capacitor 325 shown in FIG. 3. For instance, the radial features of the metal features 225 (which can be referred to as finger plates) disposed between the inner and outer rings of the metal features 225 can define plates of capacitors, with the dielectric region 226 defining respective dielectrics of those capacitors. In the example of FIG. 2, the metal features 225 and the dielectric region 226 define a network of strings of series connected capacitors (between the radial metal features 325). These strings of series connected capacitors, in this example, are connected in parallel with each other between the drain 221 of the integrated JFET via the inner circle of the metal feature 225 (e.g., to a drain of the JFET 320a and Vbulk in FIG. 3), and the Vsense terminal of the integrated voltage divider via the outer ring of the metal features 225 (e.g., Vsense terminal 324 in FIG. 3).

The source and gate region 227 can include a source and a gate of the integrated JFET of the sensing device 220 (e.g., source and gate of the FET 320a in FIG. 3), where the gate is connected to (coupled with) a power converter switching node and the source is connected to the Vboot supply voltage. The separation region 229 can include two regions of opposite conductivity type (e.g., a p-type region and an n-type region) that provides charge balance between the sensing device 220 and the surrounding high side floating pocket 210. An example of the separation region is illustrated in FIGS. 4 and 5.

Referring to FIG. 3, the voltage divider of the sensing device 320 includes a second capacitor 326 (e.g., in addition to the capacitor 325 defined by the capacitive network of FIG. 2, as discussed above). In some implementations, the capacitor 326 can be a metal-oxide-metal (MOM) capacitor that is implemented either in the high voltage region 320 (as shown in FIG. 3), or can be implemented outside the high-voltage region 320, depending on the particular implementation. In some implementations, the capacitor 326 can be used tune the voltage divider of the sensing device 320. It is noted that in the example sensing device 220 of FIG. 2, a capacitor corresponding with the capacitor 326 of FIG. 3 is not shown.

Figure 4:
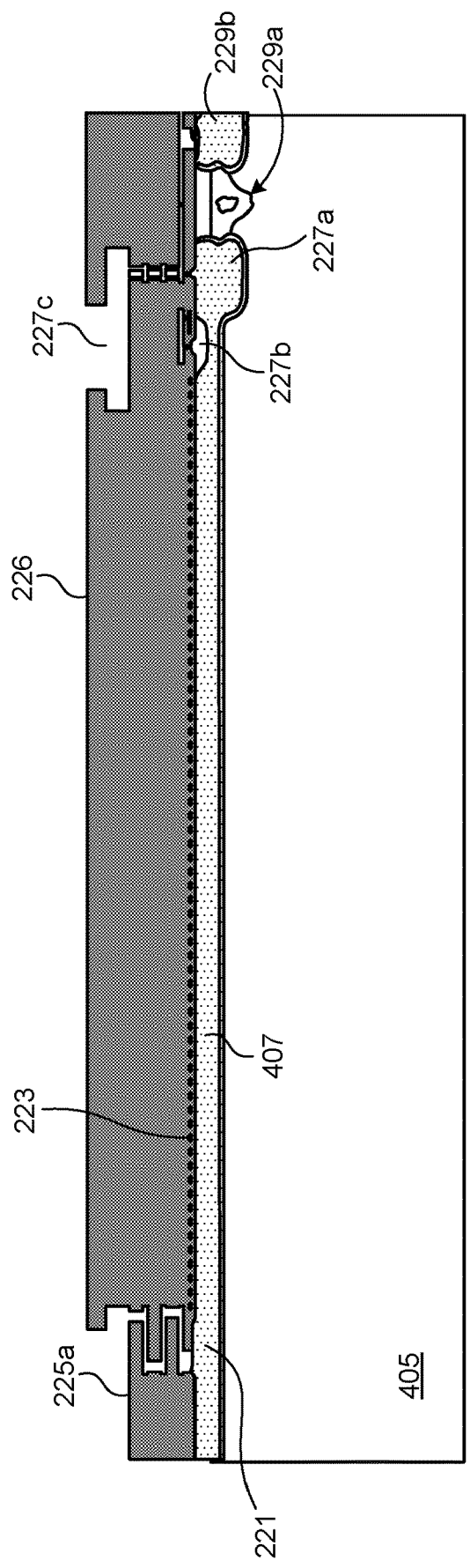
FIG. 4 is a diagram illustrating a cross-sectional view of portions of the high-voltage sensing device of FIGS. 2 and 3.
Figure 5:
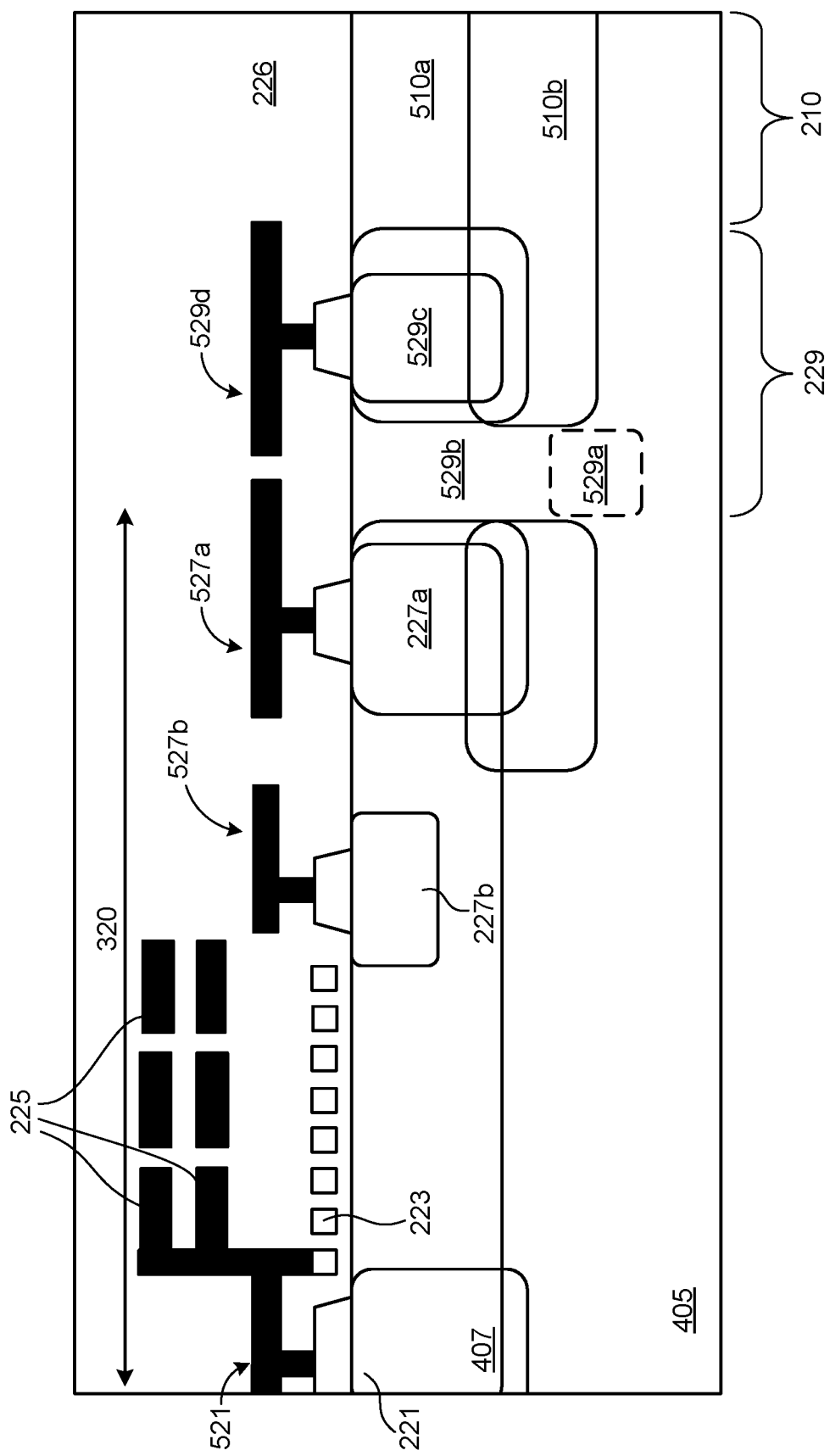
FIG. 5 is a diagram schematically illustrating a cross-sectional view of a portion of the high-voltage sensing device of FIGS. 2 and 3.

FIG. 4 is a diagram illustrating a cross-sectional view of portions of the high-voltage sensing device of FIGS. 2 and 3. The cross-sectional view shown in FIG. 4 corresponds with a cross-section of an example implementation of the sensing device 220 along the line 4-4 shown in FIG. 2. It is noted that some features (e.g., some of the metal features 225) of the sensing device 220 are not shown in FIG. 4. As illustrated in FIG. 4, the sensing device (e.g., the sensing device 220 or 320) can be implemented in a substrate 405. In some implementations, the substrate 405 can include a high-voltage epitaxial layer of a first conductivity type (or an ultra-high voltage epitaxial layer of the first conductivity type) that can be connected to (coupled with) electrical ground. The sensing device, as shown in FIG. 4, can also include a high voltage well 407 of a second conductivity type (or an ultra-high voltage well of the second conductivity type), in which the integrated JFET of the sensing device can be defined. For purpose of this discussion, the first conductivity type will be referred to as p-type conductivity and the second conductivity type will be referred to as n-type conductivity. In some implementations, these conductivity types can be reversed (e.g., the first conductivity type can be n-type and the second conductivity type can be p-type). In some implementations, there can be more than two-conductivity types, such as intrinsic conductivity, n-type conductivity and p-type conductivity in a silicon-on-insulator (SoI) implementation.

As shown in FIG. 4, the well 407 can include the drain 221 of the integrated JFET and a source 227a of the integrated JFET. A gate region 227b (e.g., a portion of a gate region) of the integrated JFET can be formed in the well 407 using a p-type implant, or p-type (e.g., high voltage) well. Example structures for implementing the drain 221, the source 227a and the gate 227b of the integrated JFET are further illustrated in FIG. 5.

FIG. 4 also illustrates an example of the separation region 229 of the sensing device 220 of FIG. 2. As shown in FIG. 4, the separation region 229 can include a p-type separation region 229a, which can include a portion of the substrate 405 and a buried p-implant (such as further illustrated in FIG. 5). As noted above, the separation regions 229a and 229b can be configured to provide charge balance between the integrated JFET of a high-voltage sensing device and the floating high-side (p-type) pocket (not shown in FIG. 4).

Metal feature 225a shown in FIG. 4 (which can, in some implementations, correspond, or be electrically connected with the inner ring of the metal features 225 in FIG. 2) provides an electrical connection to the drain 221 of the integrated JFET. Other metal structures shown in FIG. 4, and further illustrated in FIG. 5, can provide electrical connections to the source 227a, the gate 227b and the n-type separation region 229b (where the p-type separation region 229a can be coupled to electrical ground through the substrate 405).

As further illustrated in FIG. 4, the spiral resistive element 223 of the sensing device 220 can be disposed in the dielectric region 226. That is, turns of the spiral resistive element 223 are shown in the cross-sectional view of FIG. 4. The Vsense tap (Outer metal ring of the metal features 225 in FIG. 2 and the Vsense tap 324 in FIG. 3) is not specifically shown in FIG. 4 (or in FIG. 5 or 6). In such an arrangement, the integrated JFET supports (spreads, holds, etc.) the Vbulk voltage, so that breakdown does not occur from the resistive element 223 (e.g., near the drain where the voltage is at or near Vbulk) across the dielectric region 226 to the grounded substrate 405. In this example, pinched-off integrated JFET prevents such breakdown, which allows the RC divider of the sensing device to operate so as to provide a Vsense signal indicative of a voltage of the switching node SW with respect to Vbulk.

FIG. 5 is a diagram schematically illustrating a cross-sectional view of a portion of the high-voltage sensing device of FIGS. 2 and 3 along the line 5-5 shown in FIG. 2. The example shown in FIG. 5 can, in some implementations, also correspond with the cross-sectional view of FIG. 4. It is noted that in FIG. 5, as well as in the other drawings, illustrated features are not necessarily drawn to scale, such as, for instance the spiral resistive element 223, as shown in FIG. 5 (e.g., a number of turns and arrangement of the resistive element 223 with respect to other elements of the sensing device).

FIG. 5 illustrates, in cross-section, an example implementation of the elements of the sensing device 320 of FIG. 3 (which can also correspond with the sensing device 220 of FIG. 2), as well as the separation region 229 and the high-side pocket 210 of FIG. 2. As shown in FIG. 5, the drain 221 of the integrated JFET of the sensing device may be defined in the well 407, and a connection structure 521 can provide electrical connection to the drain 221. In this example, the drain connection structure 521 can include a portion of the metal features 225 of FIG. 2, as well as n-type semiconductor material (e.g., n+ material), which can form an Ohmic contact with the drain 221 portion of the well 407. The metal features 225 can also include multiple layers of radial metal features to form the series connected (parallel coupled) strings of capacitors in the capacitive network that can implement the capacitor 325 of FIG. 5, for example. While three metal layer and two layers of radial metal features are shown in FIG. 5, in some implementations, different numbers of metal layers and radial metal features can be used. As further shown in FIG. 5, the metal features 225 can also define an electrical connection between the drain 221 of the integrated JFET and the spiral resistive element 223.

The integrated JFET of the sensing device, as shown in FIG. 5 also shows the source 227a (e.g., defined by a high voltage n-type well and a n-type buried layer), and the gate 227b, which includes a p-type well region (e.g., a high-voltage p-type well). The gate of the integrated JFET can also include a connection structure 527b that includes a metal field plate and p-type semiconductor material (e.g., p+ material), which can form an Ohmic contact with the gate 227b of the integrated JFET. Likewise, the source of the integrated JFET can include a connection structure 527a that includes a metal field plate and n-type semiconductor material (e.g., n+ material), which can form an Ohmic contact with the source 227a of the integrated JFET.

As also shown in FIG. 5, with further reference to FIG. 2, the separation region 229 of the sensing device 220 of FIG. 2 can include a p-type separation region that includes a buried p-type layer (e.g., a buried p-type isolation layer) 529a, and a portion 529b of the substrate 405. The separation region 229, in the example of FIG. 5, also includes an n-type separation region 529c. A connection structure 529d can be coupled to the n-type separation region 529c, where the connection structure includes a metal field plate and n-type semiconductor material (e.g., n+ material), which can form an Ohmic contact with the n-type separation region 529c. As shown in FIG. 5, a portion of an n-type buried layer 510b can also be included in the n-type separation region.

An example structure of a p-type (high-side) floating pocket (e.g., high-side pocket 210 of FIG. 2 and/or high-side pocket 310 of FIG. 3) is also shown in FIG. 5. In this example, the high-side pocket 210 include a floating p-type region 510a (e.g., corresponding with the anode of the diode 311 in FIG. 3), a portion of the n-type buried layer 510b (e.g., corresponding the shared cathode of the diodes 311 and 312 of FIG. 3), and a portion of the substrate 405 (e.g., corresponding with the anode of the diode 312 in FIG. 3). Referring to FIGS. 3 and 5, the drain connection structure 321 can be coupled to the Vbulk supply 340, and the gate connection structure 527b can be connected to the switching node SW (e.g., supply 350). Also referring to FIGS. 3 and 5, the source connection structure 527a and the n-type separation region connection structure 529d can both be coupled to Vboot (e.g., Vcc supply 360 plus a switch node voltage from supply 350), where charge balance is achieved, at least by separating the metal field plates of the connection structures 527a and 529d in conjunction with the p-separation region (e.g., buried layer 529a and substrate portion 529b).

FIG. 6 is a diagram schematically illustrating a cross-sectional view of an example implementation of a high-voltage junction termination portion 230 of the high-voltage sensing device of FIG. 2 (or the JFET device 330 of the high voltage junction termination region of FIG. 3) along the line 6-6 shown in FIG. 2. It is noted that, in FIG. 6, as was discussed with respect to FIG. 5, illustrated features are not necessarily drawn to scale.

As can be seen from a comparison of FIG. 2 with FIGS. 5 and 6, the cross-sectional view of the example high-voltage junction termination region shown in FIG. 6 can extend from a right side of the cross-section illustrated FIG. 5. For instance, as shown in FIG. 6, a portion of the floating pocket (e.g., portions 510a and 510b) is illustrated (included) on the left side of FIG. 6. In this example, a high-voltage junction termination region of FIG. 6 is implemented using a second JFET device (where the integrated JFET of the sensing device 220, or the sensing device 320 is a first JFET). For purposes of illustration, the JFET of the high-voltage termination region illustrated in FIG. 6 will be described with further reference to the JFET 330 of FIG. 3, as well with reference to FIG. 2. In other implementations, devices other than a JFET could be used to implement the high-voltage junction termination region of FIG. 6. For instance, such devices could include LDMOS devices, IGBT devices, bipolar transistor devices, etc.

As shown in FIG. 6, the high-voltage junction termination region (e.g., JFET 300) can include (be implemented using) a high voltage (or ultra-high voltage) n-type well 607, in which the JFET 330 can be defined. As also shown in FIG. 6, high-voltage n-wells (that are at least partially disposed in the well 607) can be formed to define a source region 330a and a drain region 330c of the JFET 330. A gate region 330b (e.g., a portion of a gate region) of the JFET 330 can be formed in the well 607 using a p-type implant, or p-type (e.g., high voltage) well.

Referring to FIGS. 3 and 6, a connection structure 630c can provide an electrical connection to the drain 330c of the JFET 330. As shown in FIG. 6, the drain connection structure 630c of the JFET can include a metal field plate, as well as n-type semiconductor material (e.g., n+ material), which can form an Ohmic contact with the drain 330c of the JFET 330. The example JFET 330 of FIG. 6 also includes a source connection structure 630a including a metal field plate, and an n-type semiconductor material (e.g., n+ material), which can form an Ohmic contact with the source 330a of the JFET 320. Further, as shown in FIG. 3, the drain 330c (and the drain connection structure 630c), as well as the source 330a (and the source connection structure 630a) illustrated in FIG. 6 can be coupled with the Vboot supply terminal (e.g., the voltage of the SW node represented by the supply 350, plus the voltage of the Vcc supply 360).

The gate of the example JFET 300 shown in FIG. 6 also includes a gate connection structure 630b that includes a metal field plate and p-type semiconductor material (e.g., p+ material), which can form an Ohmic contact with the gate 330b of the JFET 330. Further, as shown in FIG. 3, the gate connection structure 630b can be connected to (coupled with) electrical ground. As shown in FIG. 3, the source terminal of the JFET 330, in this example, is floating (e.g., no-connect or N/C). Accordingly, in the arrangement shown in FIG. 3, the JFET 330 would, during operation, be off (open) and not conduct current. The JFET there is to sustain (terminate) the high-voltage present in the high-side circuitry, e.g. to prevent breakdown issues, and so forth. As discussed herein, in some implementations, other approaches for high-voltage termination can be used, such as LDMOS transistors, dielectric termination, level shifters, etc. The particular approach with depend on the specific implementation.

Figure 8:
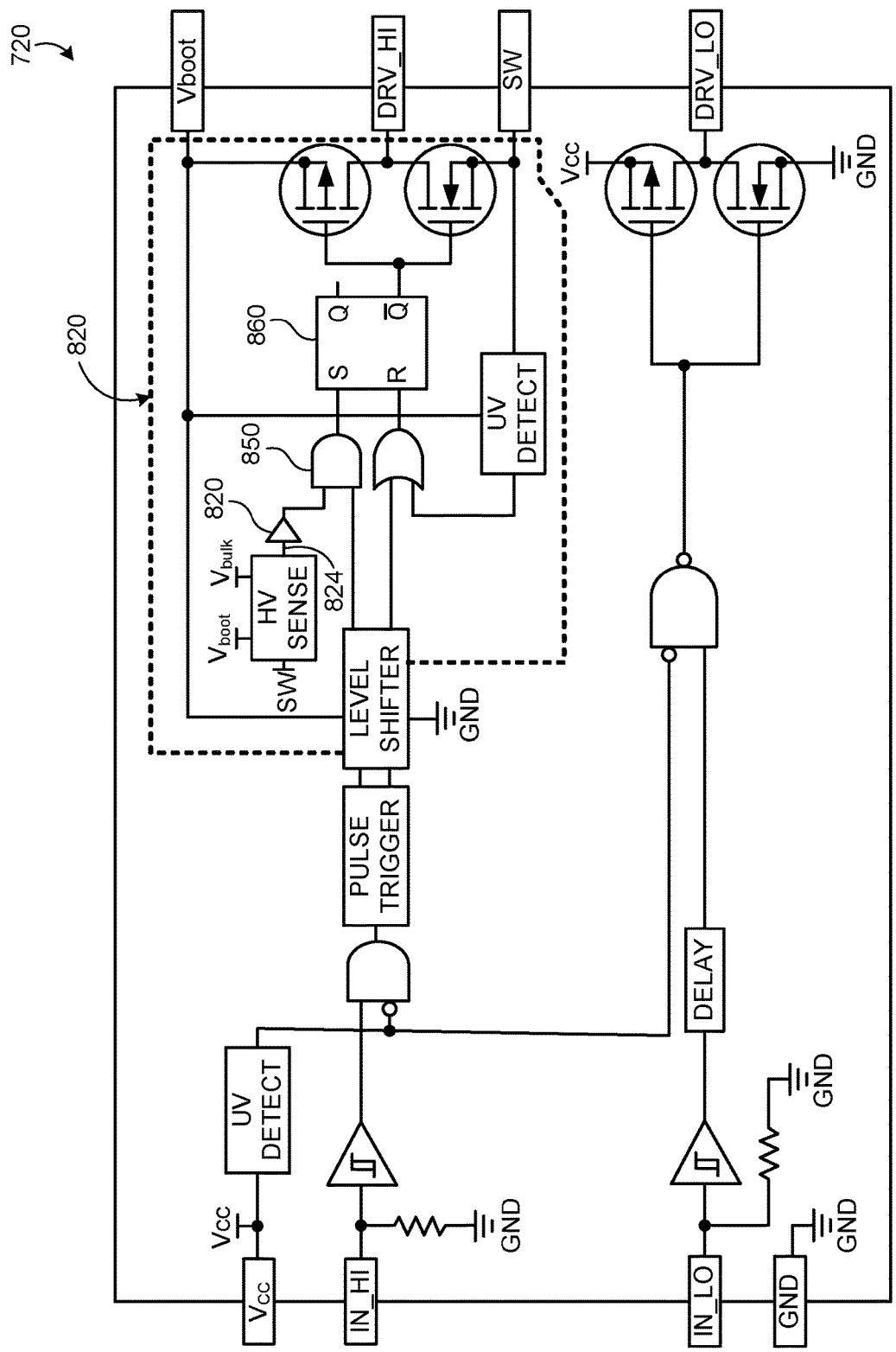
FIG. 8 is a schematic block diagram of a high-voltage integrated (control) circuit that can be implemented in the power converter circuit of FIG. 7.
Figure 9:
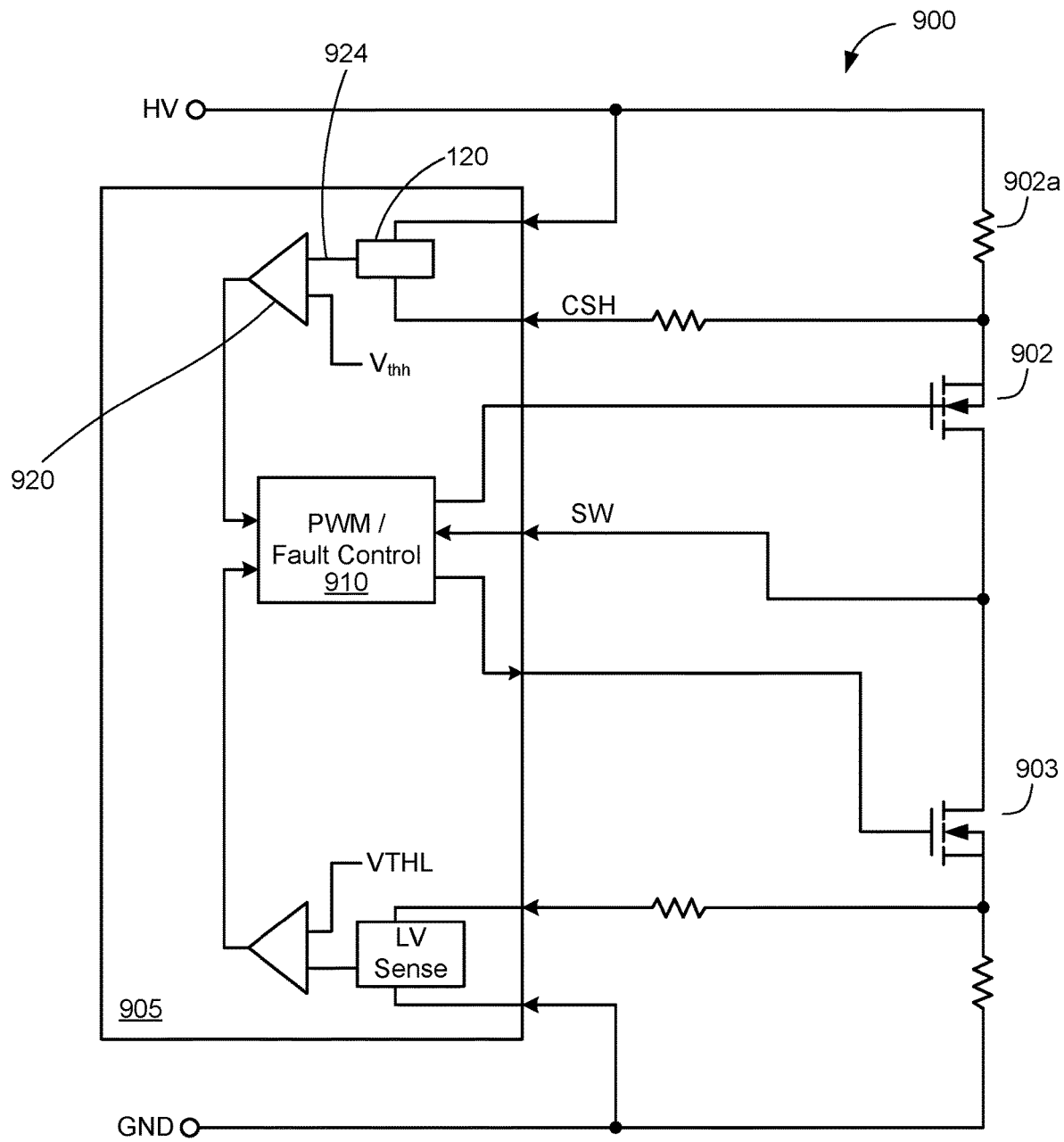
FIG. 9 is a schematic block diagram of another power converter circuit in which the high-voltage sensing device of FIGS. 2 and 3 is implemented.

FIGS. 7-9 are schematic block diagrams that illustrate example applications of power converter circuits in which the high-voltage sensing devices described herein can be implemented. The examples of FIGS. 7-9 are given by way of example, and the high-voltage sensing devices described herein can be included in a number of other power converter circuits having different configurations. Also, in FIGS. 7-9, various elements of the illustrated circuits are shown by way of reference and/or for context, and may not each be specifically described herein, or indicated with a specific reference number in the drawings. That is some elements illustrated in FIGS. 7-9 may be only represented as a schematic circuit element symbol (e.g., transformer, inductor, capacitor, diode, transistor, etc.), as a logic gate symbol (AND gate, OR gate, Schmitt trigger, etc.) or as a functional block with a text label (such as under-voltage (UV) detector, delay, pulse trigger, etc.).

FIG. 7 is a schematic block diagram illustrating a power converter circuit 700 in which the high-voltage sensing device of FIGS. 2 and/or 3 can be implemented. The circuit 700 is an example Active Flyback Converter (AFC) that includes a resonant LC transformer circuit 710 (e.g. for providing power to an electrical load via the Out+ and Out− terminals. The circuit 700 also includes a high-side power semiconductor switch 702 and a low-side power semiconductor switch 703. A switching node SW of the power converter 700 is defined between the high-side switch 702 and the low-side switch 703. The circuit 700 also includes a driver control circuit with high-voltage sense 720. For instance, in some implementations, the circuit 720 can include a high-voltage sensing device, such as the high-voltage sensing devices described herein. For instance, as described above, a high-voltage sensing device (e.g., a sensing device 120 as shown in FIG. 1) can detect, using the approaches described herein, when a drain-to-source voltage of the high-side switch 702 of the power converter 700 is at (or near zero) to allow for the control circuit 720 to perform high-side ZVS in the power converter 700.

The power converter 700 also includes a switch control circuit 730, which can provide control signals to the circuit 720 to indicate when to switch from charging of the transformer circuit 710 (e.g., the high-side switch 702 is on and the low-side switch 703 is off) to discharging of the transformer circuit 710 (e.g., the high-side switch is 702 off and the low-side switch 703 is on). As the voltage of the switch node SW will track with resonance of the transformer circuit 710, ZVS (high-side ZVS and low-side ZVS) can be performed (on the high-side and the low-side) when the resonant voltage on the SW node results in a respective 0 V drain-to-source voltage on the high-side switch 720 or the low-side switch 703. The power converter 700 also includes a capacitor 721 and a diode 722 that act as a bootstrap circuit to generate Vboot, as described herein, from the switching node SW voltage and the Vcc voltage. In FIG. 8, a high-side (high-voltage) portion 820 of the example implementation of circuit 720 is set off by a dashed line. In this example, the high-side portion can be implemented in a floating pocket, such as described herein.

FIG. 8 is a schematic block diagram of a high-voltage integrated (control) circuit that can be implemented in the driver control circuit 720 of the power converter 700 of FIG. 7. As noted above, some elements of the circuit 720 are shown in FIG. 8 for purposes of context, and by way of example. Each of these elements may not described in detail with respect to FIG. 8.

As shown in FIG. 8, a high-voltage sensing device (e.g., sensing device 120) can be included in a high-voltage circuit domain of the circuit 720 (e.g., after level shifting from a low-voltage circuit domain to the high voltage circuit domain is performed), such as in a high-voltage region, as described herein. The HV sense device 120 can, using the approaches described herein, provide an indication, e.g., on its Vsense terminal 824, that indicates when the drain to source voltage of the high-side switch in FIG. 7 is 0 V, or near zero-volts (e.g., switching node SW voltage with respect to Vbulk voltage). The Vsense signal on the Vsense terminal 824 can be provided to a comparison circuit 820 (e.g., a comparator, a Schmitt trigger, etc.) for comparison to a threshold value, so as to indicate when a 0 V drain-to-source voltage is present on the switch 702 (and ZVS can be performed). In this example, switching of the high-side switch 702 in FIG. 7 can be based on a combination, by an AND gate 850, of an output of the comparison circuit 820 and a high-side switch control signal from a level shifter 860.

FIG. 9 is a schematic block diagram of another power converter circuit 900 in which the high-voltage sensing device of FIGS. 2 and 3 can be implemented (e.g., as the high-voltage sensing device 120 in FIG. 1). The example power converter 900 is a PWM controlled AC-DC converter control circuit that can be coupled with a resonant LC transformer circuit (e.g. for providing power to an electrical load). The circuit 900 also includes a high-side power semiconductor switch 902 and a low-side power semiconductor switch 903. A switching node SW of the power converter 900 is defined between the high-side switch 902 and the low-side switch 903.

The circuit 900 also includes a PWM driver control and fault control (PWM/Fault Control) circuit 905 that includes a high-voltage sensing device 120 (e.g., implemented using the sensing devices described herein). In the circuit 900, with further reference to FIG. 3, a drain node of the integrated JFET 320a and a corresponding end of the RC divider of the sensing device 320 can be coupled to the high-voltage supply terminal (HV) and a first terminal of a high-side current sense resistor 902a of the circuit 900. Still referring to FIG. 3, a gate terminal of the integrated JFET 320a and the corresponding other end of the RC divider can be coupled to the high-side current sense line (CSH), e.g., coupled with the second terminal of the high-side current sense resistor 902a of the circuit 900. In this example implementation a source of the integrated JFET 320a can be coupled to.

In such implementations, a voltage on a Vsense terminal 924 of the high-voltage sensing device 120 can be indicative of a current flowing through the high-side switch 902 (e.g., based on a voltage across the high-side current sense resistor 902a senses by the RC divider of the sensing device 320). In this example, the voltage on the Vsense terminal 924 is provided to a comparator 920 and compared to a threshold voltage Vthh. The result of that comparison can then be provided to the PWM/Fault Control circuit 910 and the high-side switch 902 (and the low-side switch 903) can be controlled based on the comparison made by the comparator 920.

For instance, in some implementations, the comparison information from the comparator 920 (or other comparison circuit) can be used by the PWM/Fault Control circuit 910 to perform current-sense based control of an on-time of the high-side switch 902. For instance, the high-side switch 902 can be turned on based on (pre-determined) control criteria, which will depend on the specific implementation, while the high-side switch 902 can be turned off in response to the Vsense signal (on terminal 924) crossing the Vthh threshold, e.g., as indicated by the comparator 920. In other words, the output of the comparator 920 can be processed by logic of the PWM/Fault Control circuit 9210 to control turn off the high-side switch 902 based on current through the high-side switch 902 (as indicated by the Vsense signal).

In some implementations, the comparison information from the comparator 920 (or other comparison circuit) can be used by the PWM/Fault Control circuit 910 to perform over-current fault protection of the high-side switch 902. As compared to the example above of current-sense based control of an on-time of the high-side switch 902, over-current protection can include detecting a current level through the high-side switch 902 (e.g., as indicated by the Vsense signal based on a voltage across the high-side current sense resistor 902a) at which to turn off the high-side switch 902. For instance, the comparator 920 can determine that a current through the high-side switch 902 exceeds a threshold for safe operation of the power supply (e.g., is over a current limit for the high-side switch 902). Based on that detection and indication to the PWM/Fault Control circuit 910 by the comparator 920, a fault-handling protocol can be initiated by the PWM/Fault Control circuit 910, This fault-handling protocol could include turning off the power supply voltage HV, reducing current sense levels, limiting an on-time of the high-side switch 902, etc.

Figure 10:
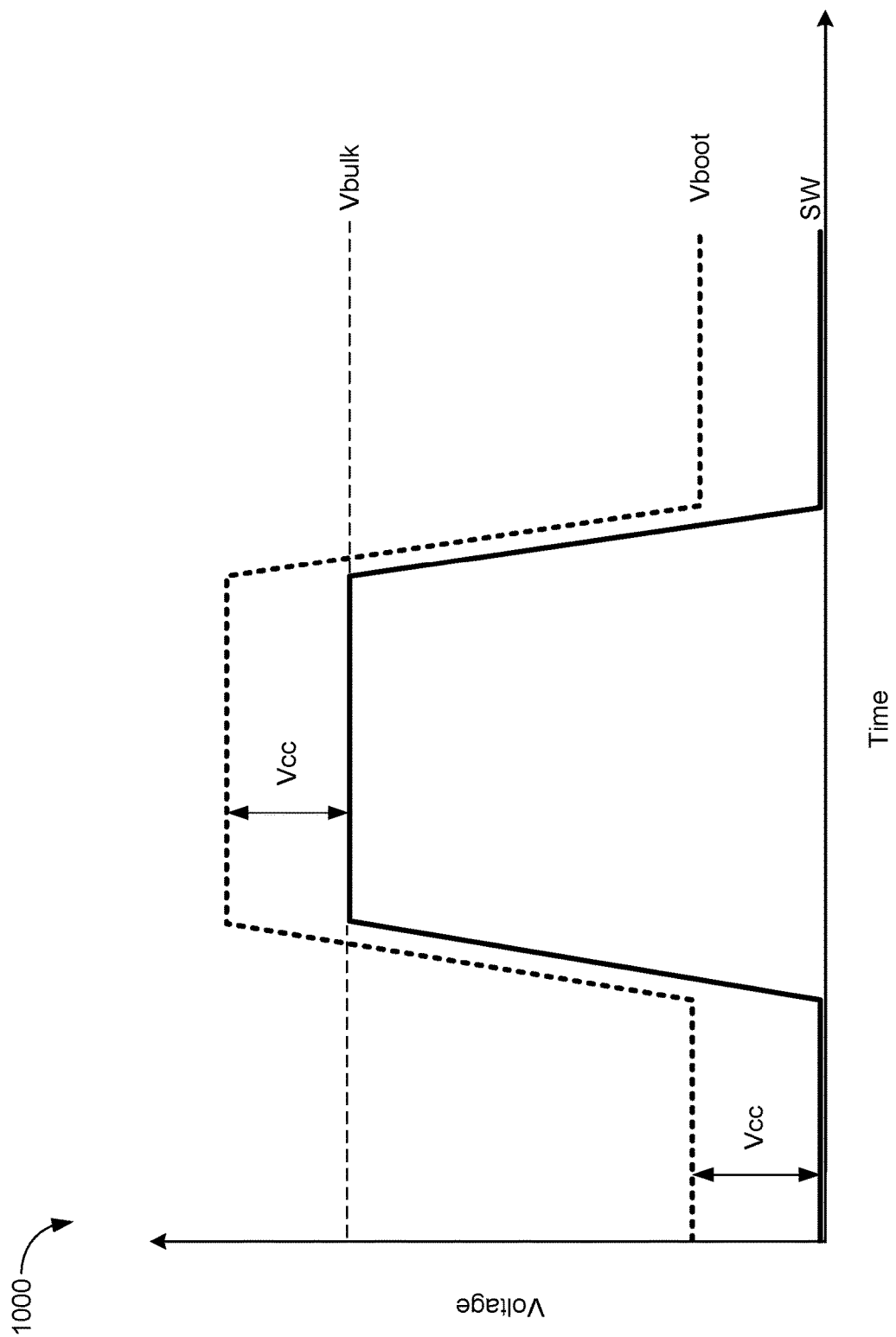
FIG. 10 is a timing diagram illustrating relationships between a bootstrap voltage, a switch node voltage and an integrated circuit power supply voltage for a power converter, such as the power converter shown in FIG. 7.

FIG. 10 is a timing diagram illustrating relationships between a bootstrap voltage (Vboot), a switching node (SW) voltage and an integrated circuit power supply voltage (Vcc) for a power converter, such as the power converter 700 shown in FIG. 7. That is, the voltages illustrated in FIG. 10 can be utilized by the high-voltage sensing devices described herein, such as is indicated in the schematic diagram of FIG. 3. As was noted above, and as illustrated in FIG. 10, a Vboot voltage can be a combination (e.g., sum) of a voltage on the switching node SW and a Vcc voltage, e.g., as combined by a bootstrap circuit (e.g., including the capacitor 721 and the diode 722, as shown in FIG. 7). As can be seen from FIG. 10, as the voltage (y-axis) of the switching node SW changes over time (x-axis), the Vboot voltage tracks with the SW voltage, but, after Vcc reaches its nominal value, the Vboot voltage is greater than the SW voltage by the Vcc voltage. As also shown in FIG. 10, the SW voltage varies from 0 V to Vbulk, while boot varies from Vcc to Vbulk+Vcc.

Figure 11A:
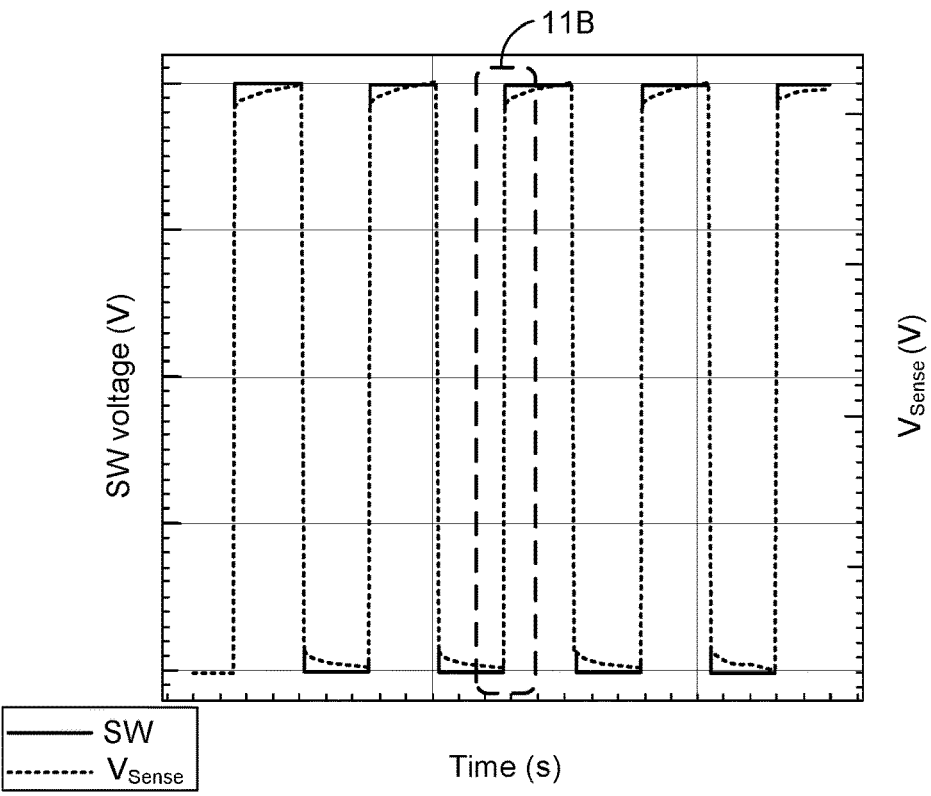
FIGS. 11A and 11B are timing diagrams illustrating a relationship between a switch node voltage and a sense terminal voltage in a high-voltage integrated (control) circuit, such as in the high-voltage sensing device of FIGS. 2 and 3.
Figure 11B:
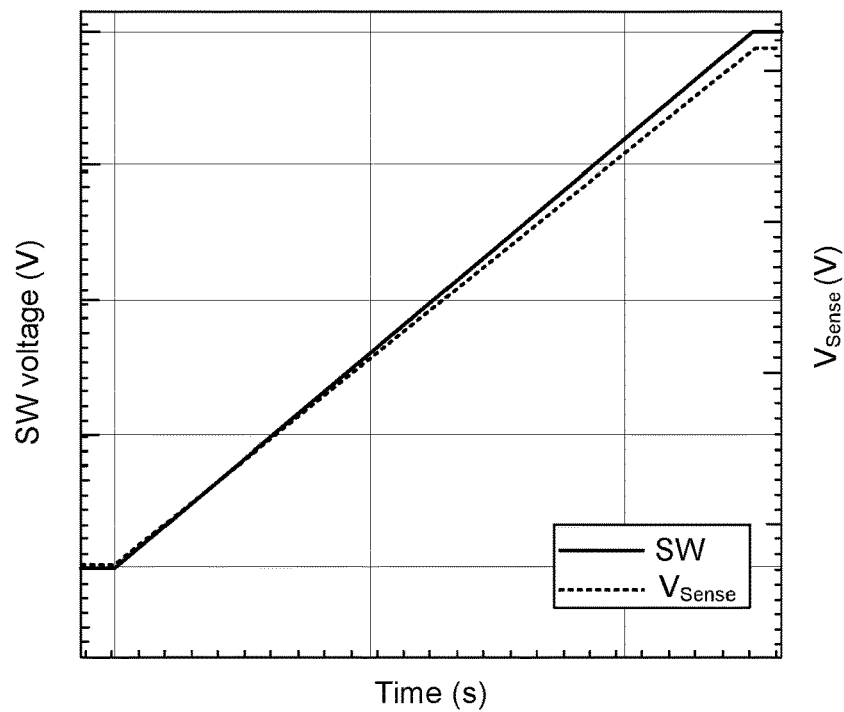

FIGS. 11A and 11B are timing diagrams illustrating a relationship between a switch node voltage and a sense terminal voltage (Vsense) in a high-voltage integrated (control) circuit (HVIC), such as the high-voltage sensing devices of FIGS. 2 and 3. The timing diagram in FIG. 11B is a close-up view with shorter time per division (as compared to the time per division FIG. 11A) of the dashed-line inset indicated as 11B in FIG. 11A.

As shown in FIGS. 11A and 11B, the Vsense voltage (normalized to the scale of the SW voltage in FIGS. 11A and 11B) tracks with the SW voltage. In an example implementation, the SW voltage can vary from 0 V to 700 V, while the Vsense voltage (indicative of the SW voltage with respect to Vbulk) can vary, e.g., from 4V to 0 V. The exact voltage ranges of the Vsense voltage and the SW voltage will, of course, depend on the particular implementation. In this example, a Vsense voltage of 4 V indicates a Vbulk to SW node voltage difference of Vbulk (e.g., 700 V, or SW voltage of 0 V). Also in this example, a Vsense voltage of 0 V indicates a Vbulk to SW node voltage difference of 0 V (e.g., SW voltage is 700 V, or equal to Vbulk), which can be used to control ZVS on a high-side switch device. Also, as discussed above, the Vsense voltage can be used (when the sensing devices described here are used to indicate high-side current) for current-based control of a high-side switch, e.g., in a PWM controlled power converter.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An integrated circuit, comprising:
a semiconductor substrate;
a low-voltage region included in the semiconductor substrate, the low-voltage region including:
  a low-side driver circuit configured to control a low-side switch of a power converter;
a high-voltage region included in the semiconductor substrate, the high-voltage region including:
  a floating region of a first conductivity type;
  a high-voltage sensing device disposed in the floating region, the high-voltage sensing device including:
    a junction-field effect transistor (JFET), the JFET being configured to operate in pinch-off mode; and
    a voltage divider including:
      a first terminal coupled to a drain of the JFET;
      a second terminal coupled to a gate of the JFET; and
      a sense terminal, the voltage divider being configured to provide, on the sense terminal, a voltage indicative of a voltage differential between the drain of the JFET and the gate of the JFET; and
a high-side driver circuit coupled with the sense terminal, the high-side driver circuit being configured to control a high-side switch of the power converter based on the voltage on the sense terminal.

2. The integrated circuit of claim 1, wherein:
a source of the JFET is configured to be coupled with a bootstrap voltage of the power converter, the bootstrap voltage varying, based on a voltage of a switch node of the power converter, between a first voltage and a second voltage; and
the gate of the JFET is coupled with the switch node of the power converter,
the first voltage being a power supply voltage of the integrated circuit, and
the second voltage being a high-voltage power supply voltage of the power converter plus the power supply voltage of the integrated circuit.

3. The integrated circuit of claim 1, wherein the JFET further includes:
a source of a second conductivity type, the second conductivity type being opposite the first conductivity type,
the drain of the JFET being of the second conductivity type; and
the gate of the JFET being of the first conductivity type.

4. The integrated circuit of claim 3, wherein:
the first conductivity type is p-type; and
the second conductivity type is n-type.

5. The integrated circuit of claim 1, wherein the voltage differential is a voltage differential between a high-voltage power supply and a switch node of the power converter.

6. The integrated circuit of claim 1, wherein the voltage differential is a voltage differential across a high-side current sense resistor of the power converter.

7. The integrated circuit of claim 1, wherein the voltage divider includes a resistive-capacitive voltage divider coupled between the drain of the JFET and the gate of the JFET.

8. The integrated circuit of claim 7, wherein the resistive-capacitive voltage divider includes:
   a first capacitor coupled between the drain of the JFET and the sense terminal; and
   a second capacitor coupled between the sense terminal and the gate of the JFET.

9. The integrated circuit of claim 8, wherein:
   the first capacitor includes a capacitive network disposed within the floating region; and
   the second capacitor includes a metal-oxide metal capacitor.

10. The integrated circuit of claim 8, wherein the second capacitor is disposed in the low-voltage region.

11. The integrated circuit of claim 7, wherein the resistive-capacitive voltage divider includes:
   a spiral resistive element disposed in the floating region, the sense terminal being coupled to the spiral resistive element to define a first resistor and a second resistor of the resistive-capacitive voltage divider,
   the first resistor being coupled between the drain of the JFET and the sense terminal; and
   the second resistor being coupled between the sense terminal and the gate of the JFET.

12. The integrated circuit of claim 11, wherein a ratio of a resistance of the first resistor to a resistance of the second resistor is greater than 100 to 1.

13. The integrated circuit of claim 1, wherein the voltage divider includes at least one of:
   a resistive voltage divider; or
   a capacitive voltage divider.

14. The integrated circuit of claim 1, wherein the low-side driver circuit and the high-side driver circuit are included in a pulse-width modulation controller.

15. The integrated circuit of claim 1, further comprising a high-voltage junction termination region disposed between the low-voltage region and the high-voltage region.

16. The integrated circuit of claim 15, wherein the high-voltage junction termination region surrounds the floating region.

17. The integrated circuit of claim 15, wherein the JFET is a first JFET, the high-voltage junction termination region including a second JFET,
   the first JFET being a first n-channel JFET and the second JFET being a second n-channel JFET,
   a gate of the second n-channel JFET being coupled to electrical ground,
   a source of the second n-channel JFET being configured to be electrically floating.

18. An integrated circuit, comprising:
   a semiconductor substrate;
   a low-voltage region included in the semiconductor substrate, the low-voltage region including:
      a low-side driver circuit configured to control a low-side switch of a power converter;
   a high-voltage region included in the semiconductor substrate, the high-voltage region including:
      a floating region of a first conductivity type;
      a high-voltage sensing device disposed in the floating region, the high-voltage sensing device including:
         a first junction-field effect transistor (JFET), the first JFET being configured to operate in pinch-off mode; and
         a voltage divider including:
            a first terminal coupled to a drain of the first JFET;
            a second terminal coupled to a gate of the first JFET; and
            a sense terminal, the voltage divider being configured to provide, on the sense terminal, a voltage indicative of a voltage differential between the drain of the first JFET and the gate of the first JFET;
      a high-side driver circuit coupled with the sense terminal, the high-side driver circuit being configured to control a high-side switch of the power converter based on the voltage on the sense terminal; and
   a high-voltage junction termination region surrounding the floating region, the high-voltage junction termination region including a second JFET.

19. The integrated circuit of claim 18, wherein:
   the first JFET is a first n-channel JFET and the second JFET is a second n-channel JFET,
   a gate of the second n-channel JFET is coupled to electrical ground,
   a source of the first n-channel JFET and a source of the second n-channel JFET are configured to be coupled with a bootstrap voltage of the power converter, the bootstrap voltage varying, based on a voltage of a switch node of the power converter, between a first voltage and a second voltage,
   the first voltage being a power supply voltage of the integrated circuit, and
   the second voltage being a high-voltage power supply voltage of the power converter plus the power supply voltage of the integrated circuit.

20. An integrated circuit, comprising:
   a semiconductor substrate;
   a low-voltage region included in the semiconductor substrate, the low-voltage region including:
      a low-side driver circuit configured to control a low-side switch of a power converter;
   a high-voltage region included in the semiconductor substrate, the high-voltage region including:
      a floating region of a first conductivity type;
      a high-voltage sensing device disposed in the floating region, the high-voltage sensing device including:
         a junction-field effect transistor (JFET), the JFET being configured to operate in pinch-off mode; and
         a resistive-capacitive voltage divider including:
            a first terminal coupled to a drain of the JFET;
            a second terminal coupled to a gate of the JFET; and
            a sense terminal, the resistive-capacitive voltage divider being configured to provide, on the sense terminal, a voltage indicative of a voltage differential between the drain of the JFET and the gate of the JFET,
         the resistive-capacitive voltage divider including:
            a first capacitor coupled between the drain of the JFET and the sense terminal;
            a second capacitor coupled between the sense terminal and the gate of the JFET;
            a spiral resistive element, the sense terminal being coupled to the spiral resistive element to define a first resistor and a second resistor of the resistive-capacitive voltage divider, the first resistor being coupled between the drain of the JFET and the sense terminal, and the second resistor being coupled between the sense terminal and the gate of the JFET; and
      a high-side driver circuit coupled with the sense terminal, the high-side driver circuit being configured to control a high-side switch of the power converter based on the voltage on the sense terminal.

21. The integrated circuit of claim 20, wherein:
the first capacitor and the spiral resistive element are disposed in the high-voltage region; and
the second capacitor is disposed in the low-voltage region.

\* \* \* \* \*